United States Patent
Jeong et al.

(10) Patent No.: US 6,952,131 B2
(45) Date of Patent: Oct. 4, 2005

(54) DIGITAL PWM INPUT D CLASS AMPLIFIER BY PWM NEGATIVE FEEDBACK

(75) Inventors: Jae-Hoon Jeong, Seoul (KR);
Goog-Chun Cho, Gunpo (KR);
Bo-Hyung Cho, Seoul (KR);
Chang-Gyun Kim, Seoul (KR);
Jong-Hu Park, Seoul (KR)

(73) Assignees: Digital and Analog Co., Ltd. (KR);
Seung-Mok Yi (KR)

( * ) Notice: Subject to any disclaimer, the term of this patent is extended or adjusted under 35 U.S.C. 154(b) by 0 days.

(21) Appl. No.: 10/912,436

(22) Filed: Aug. 5, 2004

(65) Prior Publication Data

US 2005/0012546 A1 Jan. 20, 2005

Related U.S. Application Data

(63) Continuation of application No. PCT/KR02/01817, filed on Sep. 27, 2002.

(51) Int. Cl.$^7$ ................................................. H03F 3/38
(52) U.S. Cl. ........................ 330/10; 330/251; 330/293
(58) Field of Search .......................... 330/10, 251, 293

(56) References Cited

U.S. PATENT DOCUMENTS

| | | | |
|---|---|---|---|
| 5,398,003 A | * | 3/1995 | Heyl et al. ..................... 330/10 |
| 6,091,292 A | | 7/2000 | Higashiyama et al. ........ 330/10 |
| 6,118,336 A | | 9/2000 | Pullen et al. .................. 330/10 |
| 6,232,833 B1 | | 5/2001 | Pullen .......................... 330/10 |
| 6,373,334 B1 | * | 4/2002 | Melanson ..................... 330/10 |
| 6,404,280 B1 | * | 6/2002 | Jeng ............................. 330/10 |
| 6,594,309 B1 | * | 7/2003 | Botti et al. ................. 375/238 |
| 6,628,221 B2 | * | 9/2003 | Jin ............................. 341/152 |

FOREIGN PATENT DOCUMENTS

| | | |
|---|---|---|
| JP | 6-29757 | 2/1994 |
| WO | WO 99/08379 | 2/1999 |

* cited by examiner

Primary Examiner—Patricia Nguyen
(74) Attorney, Agent, or Firm—St. Onge Steward Johnston & Reens LLC

(57) ABSTRACT

Disclosed is a digital PWM input D class amplifier by PWM negative feedback. The amplifier includes: digital modulation part for modulating PCM signal of input audio to PWM signal; pulse width generating and correcting part for comparing difference between the PWM signal and output signal negatively fed back, with PWM ramp signal to generate PWM switching signal; output part for generating an amplified output audio signal in response to the PWM switching signal of the pulse width generating and correcting part; and voltage negative feedback loop for negatively feeding back signal of the output part and decreasing a harmonic component to provide the signal to the pulse width generating and correcting part. Thus, the invention compares the negative feedback signal with positive/negative (+/−) saw tooth PWM ramp signal to control On/Off time period of switching transistor and the PWM pulse width and thereby enhance the linearity of the output PWM.

5 Claims, 5 Drawing Sheets

… (1)

DIGITAL PWM INPUT D CLASS AMPLIFIER BY PWM NEGATIVE FEEDBACK

This application is a continuation of PCT/KR02/01817 filed Sep. 27, 2002.

TECHNICAL FIELD

The present invention relates to a D class amplifier switched in a digital pulse width modulation (PWM), and more particularly, to a digital PWM D class amplifier employing a PWM negative feedback, in which the pulse width of a switching signal is corrected by a PWM ramp signal with respect to a continuous delay of a pulse edge of an output signal which is amplified with a digital PWM as an input.

BACKGROUND ART

Generally, the amplifier circuits are classified into A-class, B-class, AB-class and the like. Most of currently used amplifiers employ these types. Then, the A-class, B-class, AB-class amplifiers have a high linearity, but when realized as a high output amplifier, they need a heat radiation plate owing to occurrence of a vast power loss, so that their volume is increased and efficiency is lowered.

Due to these limitations, there appears a tendency which amplifiers performing the amplification not by a linear operation but by a switching operation are actively researched and developed.

D class amplifier is anticipated to show an efficiency of 90% or so, and accordingly to be advantageous in reducing the product size by remarkably reducing the size of the heat radiation plate due to the decrease of the heat emission.

FIG. 1 is a circuit diagram of a basic D class amplifier.

Referring to FIG. 1, a D class amplifier includes a harmonic square wave oscillator 11 for obtaining a constant period of signal, an integrator 12 for converting to a triangular wave a square wave that is an output signal of the harmonic square wave oscillator 11, a differential amplifier 13 for amplifying an audio input signal and a feedback signal, an adding amplifier 14 for amplifying a difference between an output signal of the differential amplifier 13 and an output signal of the integrator 12, a Schmitt trigger driving part 15 for complementarily operating switching transistors Q1, Q2, a filter for filtering output signals of the switching transistors Q1, Q2, and a speaker 17.

The D class amplifier 10 constructed as above generates a PWM signal by inputting an output signal which is negatively fed back to the differential amplifier 13, and performs the signal amplification by switching the transistors with the generated PWM signal. By doing so, the D class amplifier 10 obtains a high linearity.

Then, the conventional D class amplifier can be used in the analog input D class amplifier by negatively feeding back an analog output signal of the output filter 16, but it cannot be applied to an amplifier which accepts a digital input (PCM signal), which acts as a factor lowering the performance of the conventional D class amplifier. Accordingly, there is currently strongly requested a research and development for improving the D class amplifier which receives the digital input signal.

DISCUSSION OF THE INVENTION

Accordingly, the present invention is directed to a digital PWM input D class amplifier by a PWM negative feedback that substantially obviates one or more problems due to limitations and disadvantages of the related art.

It is an object of the present invention to provide a digital PWM input D class amplifier by a PWM negative feedback, in which a digital PWM input is used in an amplifier using a digital modulation switching way of D class amplifier and a negative feedback loop is fabricated to introduce a complete digital concept.

Additional advantages, objects, and features of the invention will be set forth in part in the description which follows and in part will become apparent to those having ordinary skill in the art upon examination of the following or may be learned from practice of the invention.

To accomplish the above object and other advantages, there is provided a digital PWM input D class amplifier by a PWM negative feedback. The amplifier includes: a digital modulation part for modulating a PCM signal of an input audio to a PWM signal; a pulse width generating and correcting part for comparing a difference between the PWM signal of the digital modulation part and an output signal negatively fed back, with a PWM ramp signal to generate a PWM switching signal; an output part for generating an amplified output audio signal in response to the PWM switching signal of the pulse width generating and correcting part; and a voltage negative feedback loop for negatively feeding back a signal of the output part and decreasing a harmonic component to provide the signal to the pulse width generating and correcting part.

It is to be understood that both the foregoing general description and the following detailed description of the present invention are exemplary and explanatory and are intended to provide further explanation of the invention as claimed.

BEST MODES FOR CARRYING OUT THE INVENTION

Hereinafter, preferred embodiments of the present invention will be described in detail with reference to the accompanying drawings.

Figure 1:
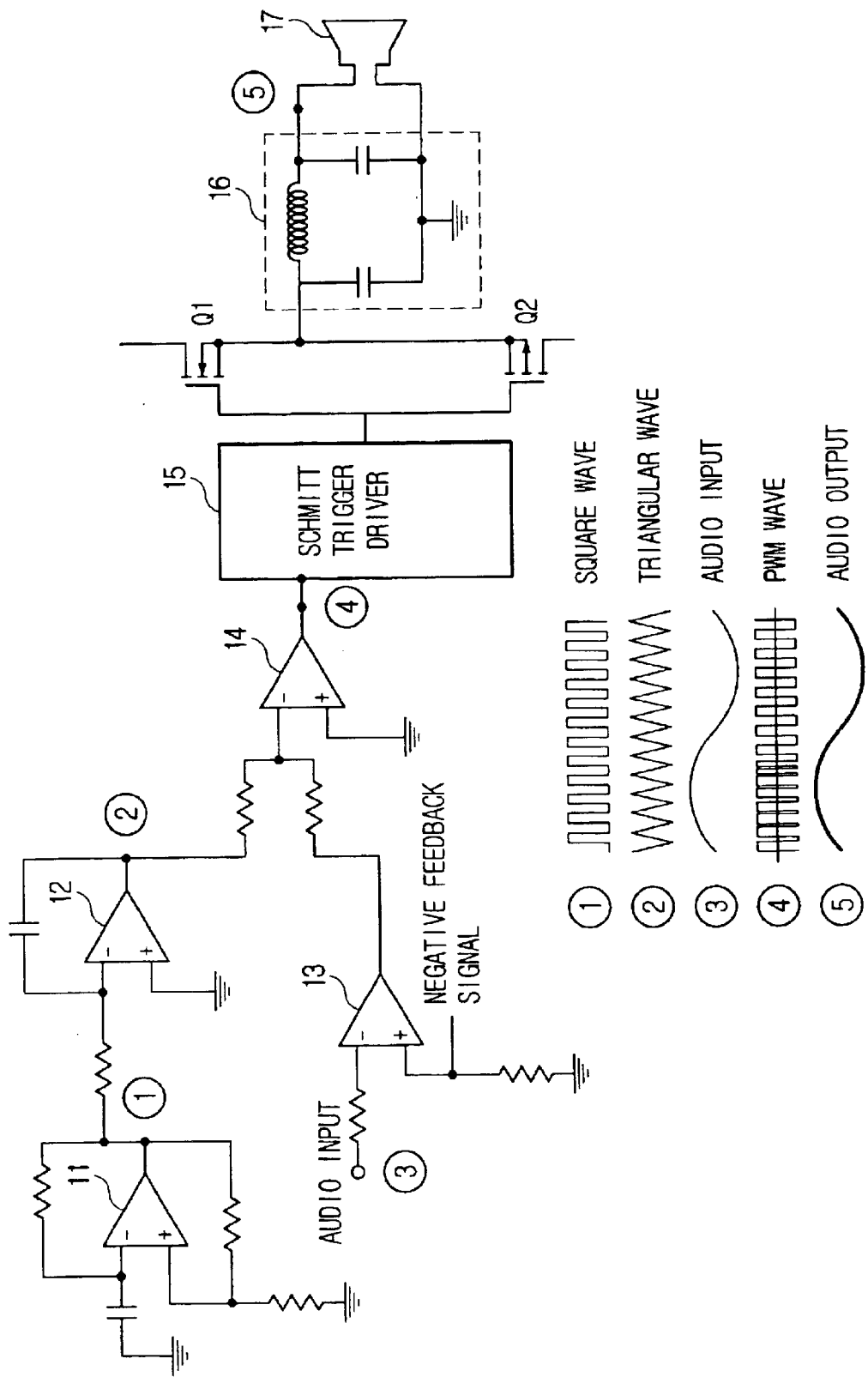
FIG. 1 is a circuit diagram of a basic D class amplifier.
Figure 2:
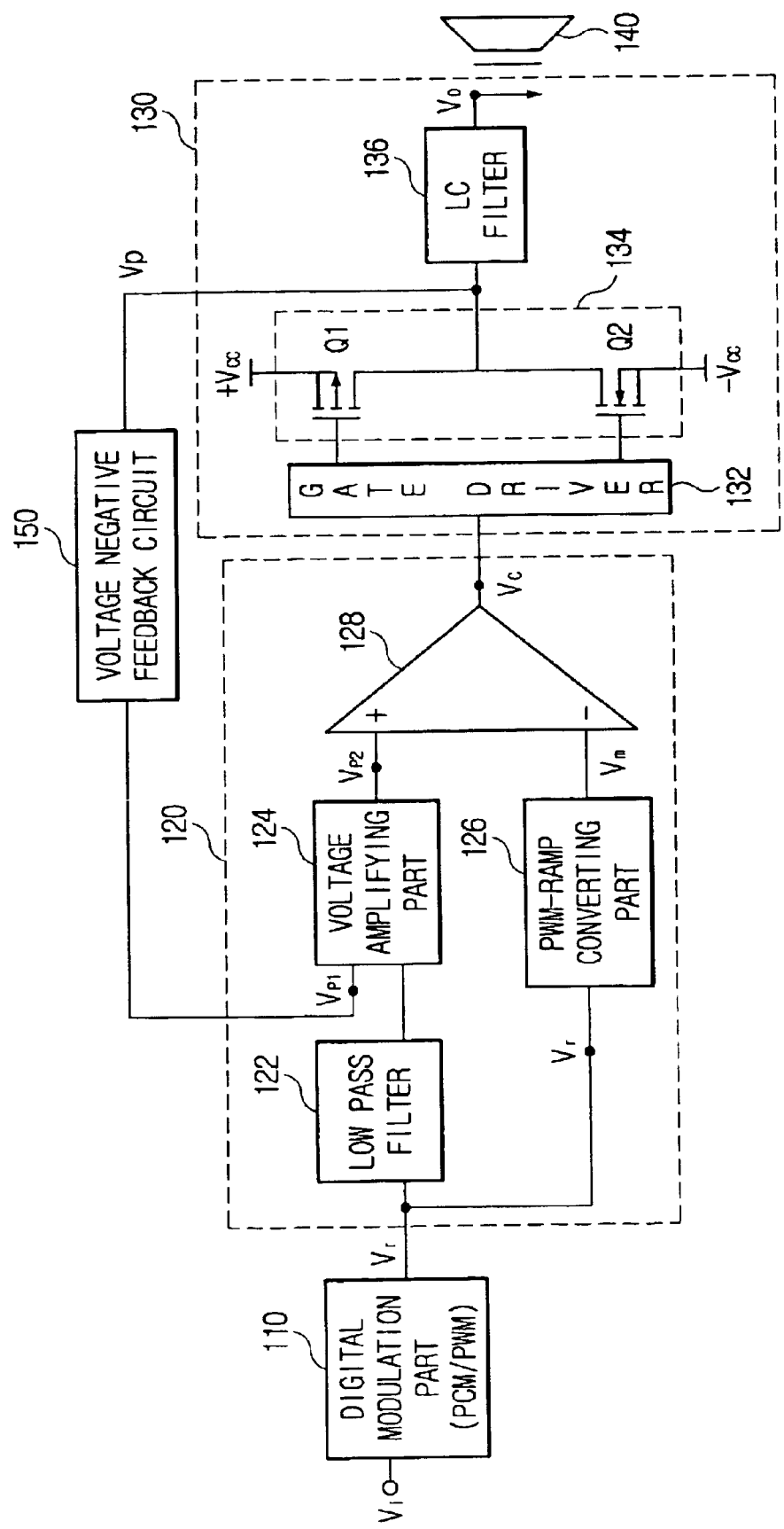
FIG. 2 is a circuit block diagram of a digital PWM input D class amplifier by a PWM negative feedback according to the present invention.

FIG. 2 is a circuit block diagram of a digital PWM input D class amplifier by a PWM negative feedback according to the present invention. Referring to FIG. 2, a D class amplifier of the invention includes a digital modulation part 110, a pulse width generating and correcting part 120, an output part 130, a speaker 140 and a voltage negative feedback loop 150.

The digital modulation part 110 modulates a PCM signal Vi of an input audio to a PWM signal Vr to provide the modulated PWM signal to the pulse width generating and correcting part 120.

The pulse width generating and correcting part 120 includes a low pass filter 122 for controlling frequency feature of the whole system while suppressing the harmonic component of the PWM signal Vr of the digital modulation part 110, a voltage amplifying part 124 for amplifying the difference between the PWM signal which has passed the low pass filter 122 and a signal Vp1 of the voltage negative feedback loop 150, a PWM-ramp converting part 126 for receiving the PWM signal Vr of the digital modulation part 110 to generate a PWM ramp signal Vm, and a comparing part 128 for comparing an output signal Vp2 of the voltage amplifying part 124 and the PWM ramp signal Vm of the PWM-ramp converting part 126 to generate a PWM switching signal Vc.

The output part 130 includes a gate driver 132 for amplifying the PWM switching signal Vc of the pulse width generating and correcting part 120, a switching transistor 134 (Q1, Q2) of MOSFET which are switched by output signals of the gate driver 132, an LC filter 136 for demodulating a signal of the switching transistor 134 into an output audio signal and outputting the demodulated output audio signal, and the speaker 140 for outputting the output audio signal of the LC filter 136 to the outside. Here, the LC filter 136 is a low pass filter to function as a digital-analog converter.

The voltage negative feedback loop 150 negatively feeds back the amplified signal Vp of the switching transistor 134 of the output part 130 and decreases the harmonic component to provide the signal to the voltage amplifying part 124.

Figure 3:
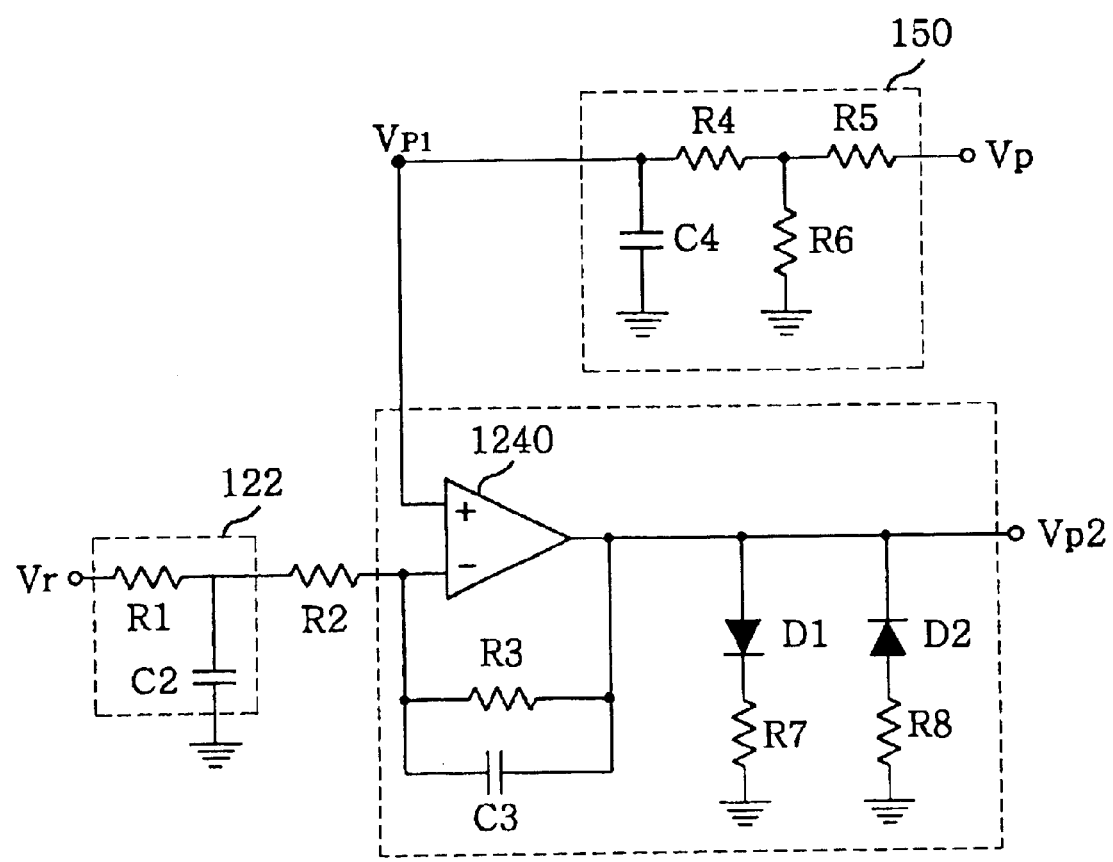
FIG. 3 is a circuit diagram showing the filter, the voltage amplifier and the voltage negative loop of FIG. 2 in detail according to an embodiment of the present invention.

FIG. 3 is a circuit diagram showing the filter, the voltage amplifier and the voltage negative loop shown in FIG. 2.

Referring to FIG. 3, the filter 122 of the pulse width generating and correcting part 120 is a low pass filter comprised of a resistor R1 and a capacitor C1, and transfers to the voltage output part 124 the PWM signal Vr which is modulated at the digital modulation part 110.

The voltage amplifying part 124 includes an OP amp 1240 of which the negative (−) input terminal accepts the output signal of the filter 122 and the positive (+) input terminal accepts the signal Vp1 of the voltage negative feedback loop 150. The OP amp 1240 amplifies the difference between the two input signals and outputs an amplified signal Vp2. Since the signal Vp1 of the voltage negative feedback loop 150 is a square wave signal that is outputted from the output switching transistor Q1, Q2, it shows the same pulse shape as the PWM signal Vr that is the output of the filter 122 but has a signal waveform of which amplitude is amplified and phase is delayed by a few degree.

The negative (−) input terminal of the OP amp 1240 of the voltage amplifying part 124 is connected to a resistor R2, and a resistor R3 and a capacitor C3 are connected in parallel between the resistor R2 and the output terminal of the OP amp 1240. Here, the resistors R2 and R3 determine a gain (R3/R2) of the OP amp 1240, and the resistor R3 and capacitor C3 that are connected in parallel and negatively feed back the output of the OP amp 1240 add a pole within the voltage negative feedback loop 150 to thereby remove a phase margin and a riffle of a frequency that is inputted to the OP amp 1240 and improve the performance and direct current stability of an audible band. Preferably, a corner frequency of the resistor R3 and the capacitor C3 is set within a range of a few KHz to a few ten KHz. Diodes D1, D2 and resistors R7, R8 are connected to the output terminal of the OP amp 1240, and they function to limit the output signal Vp2 of the voltage amplifying part 124 not to exceed ± a few volts (V).

The voltage negative feedback loop 150 is comprised of resistors R4, R5, R6 and a capacitor C4. Resistors R5 and R6 functions to drop the output voltage Vp of the switching transistor 134 to be a similar level. At this time, gain is determined $$\text{``}\frac{R5}{R5+R6}\text{''}$$

to have a ratio of $$\text{``}\frac{Vr}{Vp}\text{''}.$$

The capacitor C4 and the resistor R4 serve as a two-pole compensator to add a pole within the negative feedback loop. By doing so, the harmonic component of the output voltage Vp2 of the voltage amplifying part 124 is attenuated. Here, an RC time constant of the resistor R4 and the capacitor C4 is set slightly greater than the time constant of the filter 122 within 20 KHz.

Figure 4:
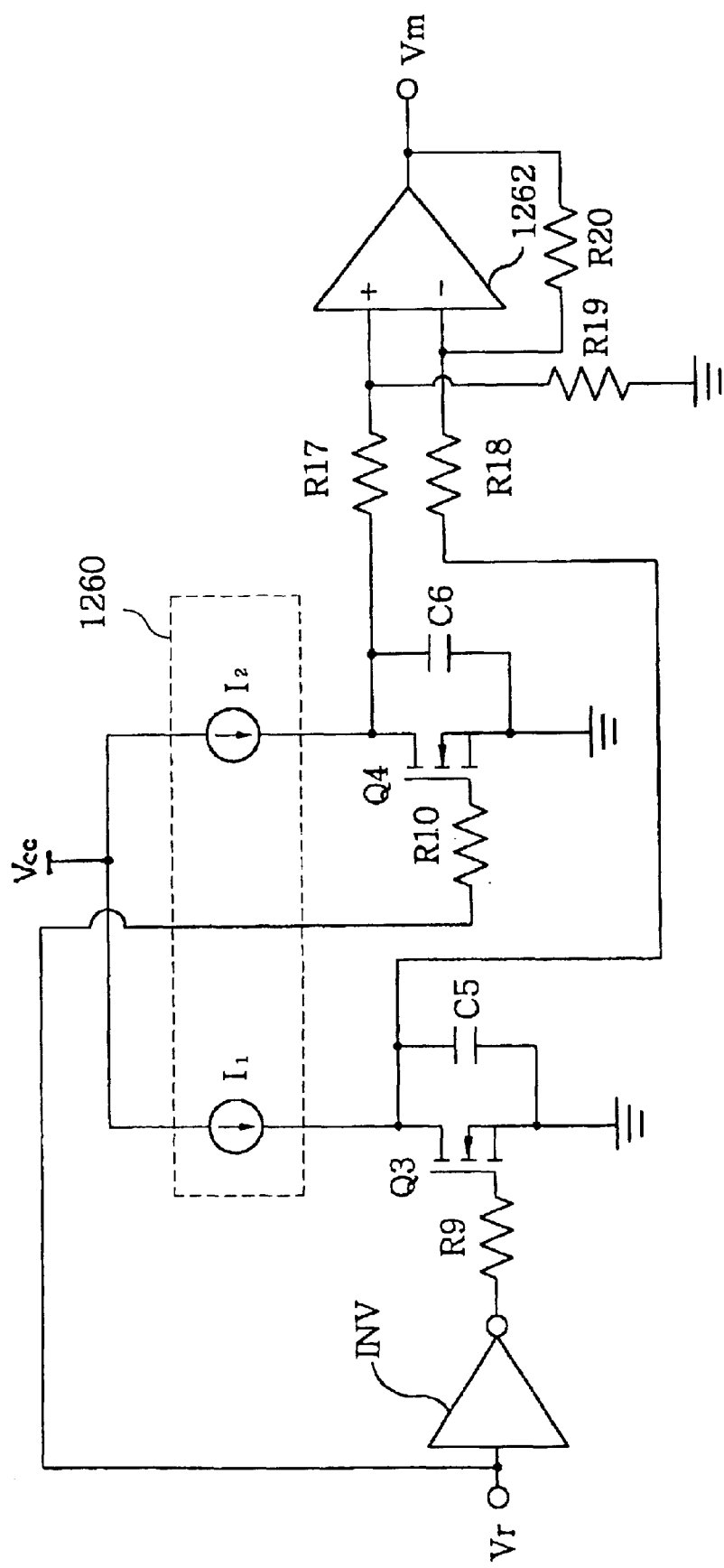
FIG. 4 is a circuit diagram of the PWM-ramp converting part of FIG. 2 according to an embodiment of the present invention.

FIG. 4 is a circuit diagram of the PWM-ramp converting part of FIG. 2 according to an embodiment of the present invention.

Referring to FIG. 4, the PWM-ramp converting part 126 generates a positive/negative (+/−) saw tooth signal, and it includes an inverter INV, a constant current source 1260, first and second capacitors C5, C6, first and second switching transistors Q3, Q4 of MOSFET which are complementarily switched to charge or discharge the first and second capacitors C5, C6, and a differential amplifier 1262 for differentially amplifying signals outputted through the first and second transistors Q3, Q4 to generate the PWM-ramp signal Vm.

Here, the PWM signal Vr modulated at the digital modulation part 110 is transmitted to the gate of the second switching transistor Q4 and the PWM signal Vr inverted through the inverter INV is transmitted to the gate of the first switching transistor Q3.

The constant current source 1260 consists of I1 and I2. The respective outputs of the constant current source 1260 are connected to the drains of the transistors Q3, Q4 and the capacitors C5, C6 and their nodes are connected to the positive/negative (+/−) terminals of the differential amplifier 1262 via resistors R17, R18.

The gain of the PWM-ramp converting part 126 is proportional to a gain of 1/K by the slope K of the positive/negative (+/−) saw tooth ramp signal Vm. If the value of K is made small, it is possible to control the gain of the differential amplifier 1262 with ease.

Operations of the digital PWM input D class amplifier according to the invention will be described with reference to FIGS. 2 to 4.

First, PCM signal Vi of input audio is converted to PWM signal Vr by the digital converting part 110.

Then, the PWM signal Vr and the signal Vp1 that is negatively fed back through the voltage negative feedback loop 150 are inputted to the pulse width generating and correcting part 120 to generate PWM switching signal Vc which is pulse width-modulated through the filter 122, the voltage amplifying part 124, the PWM-ramp converting part 126 and the comparing part 128. The pulse width modulation process is as follows.

First, the PWM signal Vr is filtered through the filter 122 to remove the harmonic component thereof, and its frequency feature is changed matched with the system. The filtered PWM signal Vr is provided to the voltage amplifying part 124. The OP amp 1240 of the voltage amplifying part 124 amplifies the difference between the PWM signal (Vr) and the signal Vp1 of the voltage negative feedback loop 150 and outputs the amplified signal Vp2.

The PWM-ramp converting part 126 accepts the PWM signal Vr to generate the saw tooth ramp signal Vm which increases in positive (+) direction and negative (−) direction with respect to zero (0) in proportional to the PWM pulse width. At this time, the differential amplifier 1262 generates the positive/negative (+/−) saw tooth signal Vm by amplifying the signals which are generated by the capacitors being charged or discharged through the transistors Q3, Q4 by the constant current source 1260.

The comparing part 128 compares the positive/negative (+/−) saw tooth signal Vm generated at the differential amplifier 1262 with the output signal Vp2 of the amplifier 1240 of the voltage amplifying part 124 to generate the PWM switching signal Vc. In other words, the comparing part 128 outputs the PWM switching signal Vc of a high level if the output signal Vp2 of the amplifier 1240 is greater than the positive/negative (+/−) saw tooth signal Vm, while it outputs the PWM switching signal Vc of a low level if the output signal Vp2 of the amplifier 1240 is not greater than the positive/negative (+/−) saw tooth signal Vm. As a result, the PWM switching signal Vc has a square waveform of which the pulse width is modulated.

The PWM switching signal Vc generated at the comparing part 128 is outputted to the speaker through the output part 130. Hereinafter, its detailed operation will be described.

Since the PWM switching signal Vc is a negligibly small signal that cannot switch the switching transistors Q1 and Q2, it is amplified by the gate driver 132 and then is provided to the gates of the switching transistors Q1 and Q2. If the output of the gate driver 132 is a low level, transistor Q1 is turned on and a high level signal is outputted to the output terminals of the switching transistors Q1 and Q2 through the transistor Q1. On the contrary, if the output of the gate driver 132 is a high level, transistor Q2 is turned on and a low level signal is outputted to the output terminals of the switching transistors Q1 and Q2 through the transistor Q2. Here, the switching frequencies of the switching transistors Q1 and Q2 are a few hundred KHz and the obtained square wave signal has the PWM waveform that is the same in width as but is greater in amplitude than the input Vc. The PWM signal generated through the switching transistors Q1 and Q2 is inputted to the LC filter 136 functioning as an analog-digital converter. The PWM signal has an audio signal for amplification and a radio frequency switching signal that is mixed with and is ten times or more greater in frequency than the audio signal. The LC filter 136 passes the audio signal but filters the switching signal. By doing so, finally amplified output audio signal Vo is obtained.

Thus, the PCM signal Vi which is an initial input audio having a low level is amplified to a signal Vo having a high level by the pulse width modulation and switching method of the invention and the amplified signal is outputted through the speaker 140.

In the meanwhile, the PWM input D class amplifier of the invention may negatively feed back and correct the output signal through the pulse width generating and correcting part 120. Operation thereof will be described with reference to FIG. 5.

Figure 5:
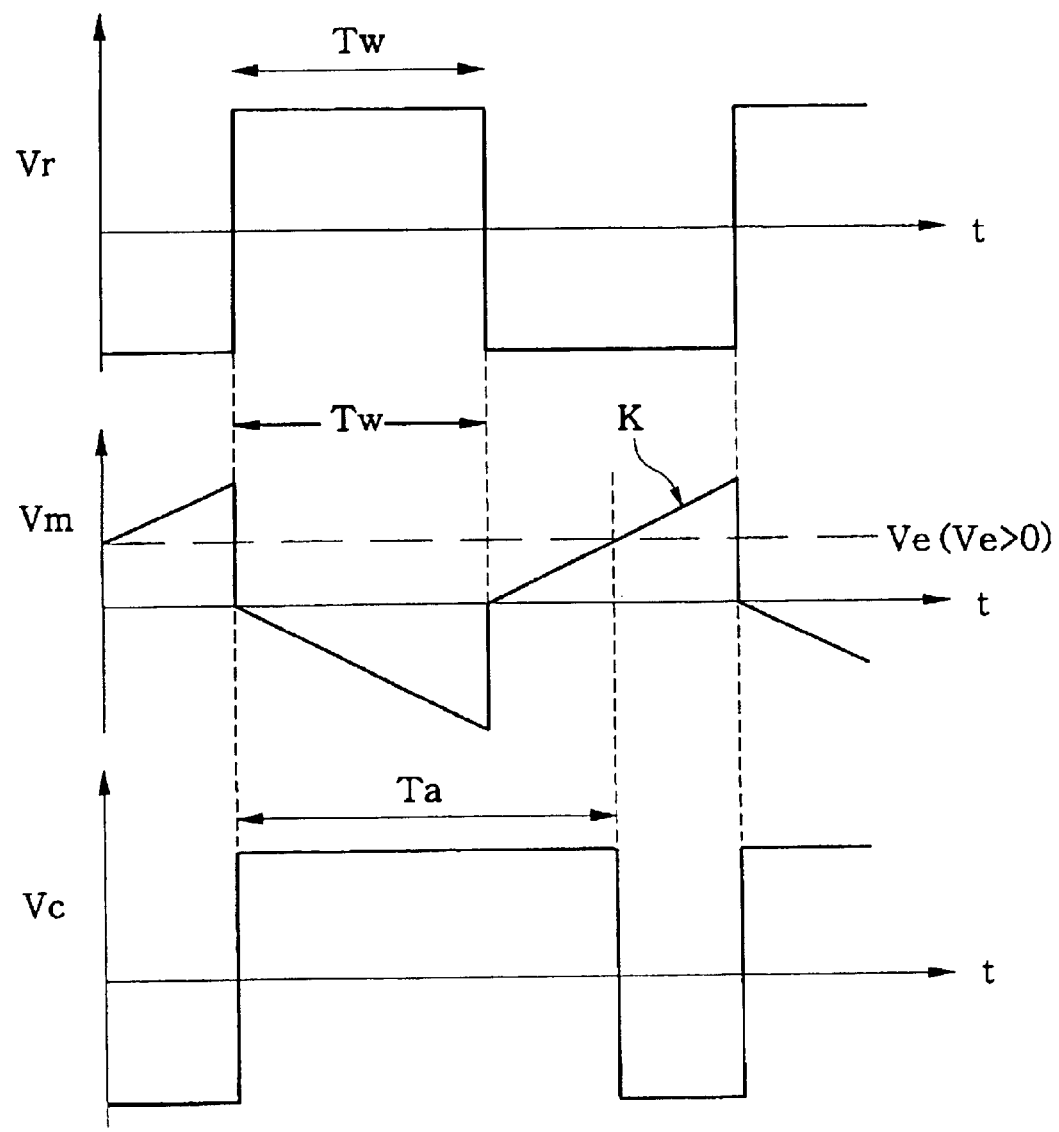
FIG. 5 is a view showing signal waveforms of the digital modulation part, the PWM-ramp converting part and the comparing part of FIG. 4.

FIG. 5 is a view showing signal waveforms of the digital modulation part, the PWM-ramp converting part and the comparing part of FIG. 4.

Referring to FIGS. 3 to 5, the digital modulation part 110 of the invention generates a PWM signal Vr having a pulse width Tw. The PWM-ramp converting part 126 generates a saw tooth wave ramp signal Vm having a negative (−) slope (K) when the PWM signal Vr is a high level, while it generates a saw tooth wave ramp signal Vm having a positive (+) slope (K) when the PWM signal Vr is a low level. At this time, the positive/negative saw tooth wave ramp signal has the same pulse width as the PWM signal Vr.

Referring to FIG. 4, if the signal Vr is inputted in a high level state, the second switching transistor Q4 is turned on to discharge the second capacitor C6 and at the same time the first switching transistor Q3 is turned off by a low level of the signal Vr inverted through the inverter INV to charge the first capacitor C5 from the constant current source I1. The voltage charged in the capacitor C5 forms a nearly linearly rising straight line. Accordingly, the output Vm of the differential amplifier increases linearly and when the PWM signal Vr is transited from a high level to a low level, the first switching transistor Q3 is turned on to discharge the first capacitor C5. Accordingly, the output Vm of the differential amplifier 1262 drops to zero (0) volt instantly and thus a negative saw tooth ramp signal is obtained through the PWM-ramp converting part 126.

While the PWM signal Vr is in a low level, the first switching transistor Q3 is turned on by a high level of the signal Vr inverted in the inverter INV to discharge the first capacitor C5. At the same time, the second switching transistor Q4 is turned off to charge the second capacitor C6 from the constant current source I2. Accordingly, the output Vm of the differential amplifier 1262 increases linearly in the positive (+) slope direction and when the PWM signal Vr is transited from a low level to a high level, the second switching transistor Q4 is turned off to discharge the second capacitor C6. Accordingly, the output Vm of the differential amplifier 1262 drops to zero (0) volt instantly and thus a positive saw tooth ramp signal is obtained through the PWM-ramp converting part 126.

The drain voltages of the first and second switching transistors Q3 and Q4 are inputted to the positive and negative input terminals respectively. At this time, if the resistance of the differential amplifier 1262 is balanced, i.e., "R20/R17=R19/R18", the differential amplifier 1262 is designed to sense the difference between the two voltage signals applied at its two input terminals, multiply this by a gain of "R20/R17", and cause the resulting voltage Vm to appear at output terminal.

The PWM-ramp converting part 126 repeats the aforementioned operation every period of the PWM signal Vr to generate the positive/negative (+/−) saw tooth ramp signal Vm. The ramp signal is inputted to the comparing part 128 and compared with the output signal Vp2 of the voltage amplifying part 124 at the comparing part 128 to generate the PWM switching signal Vc having a pulse width with delayed by a transition time with respect to a reference PWM voltage Ve. As a result, the input pulse width of the gate driver 132 is varied, and thus the On/Off time of the switching transistor Q1, Q2 is changed to enable to correct an error of the output audio signal Vo. In addition, since saw tooth ramp signal is always generated in the PWM-ramp converting part 126 regardless of the pulse width of the input audio signal Vi, there is no limitation in the modulation index. Also, since the pulse width of the corrected PWM switching signal Vc is varied from zero to the entire switching period, there is no limitation in the pulse width size correcting an error of the output audio signal Vo, thereby permitting a precise control of the output compensation by the voltage negative feedback.

INDUSTRIAL APPLICABILITY

As aforementioned, the digital PWM input negative D class amplifier of the invention performs signal amplification along with the output signal correction by using the PWM signal itself which the input audio is pulse-modulated, to remove the necessity of the D/A converter and digitalize the conventional various analog circuit functions.

Also, the invention replaces the pulse width modulation carrier triangular wave generator used in the conventional D class amplifier with the ramp generating part using the PWM signal, so that the circuit complexity is simplified, the production costs are saved, and securing the linearity in a high switching frequency operation is advantageous. In other words, in case of the conventional art in which the conventional carrier triangular wave generator is used, the carrier frequency should be also elevated to perform a switching at a high frequency, which causes a difficulty in realizing the linearity of the carrier triangular wave. However, the invention accepts the PWM of a high frequency as an input in advance and realizes a ramp wave having a low slope, which makes it easy to realize the linearity relatively.

Further, the invention can obtain the performance comparable to the conventional analog amplifier by increasing the gain of the correction circuit, thereby increasing the loop gain and then applying the negative feedback.

Furthermore, the output signal of the D class amplifier of the invention operates in a pulse width modulation and thus the output device has On or Off state. To this end, there is few energy loss. Substantially, at the output terminal of the D class amplifier, when the switch state is changed from On state to Off state or from Off state to On state, switching loss is generated. When the switching state is in On state, there exists an energy loss due to inner resistance of the output device, so that a high efficiency of 90% or more appears in real circumstances.

Also, the invention has an energy saving effect. Generally, the D class amplifier shows a superior efficiency but it also has a limitation of poor performance. However, the invention digitalizes the negative feedback correction process of the output signal to make it easy to fabricate a single chip. Accordingly, if all the conventional analog amplifiers are replaced with the D class amplifiers of the invention, a performance in excess of that of the same level amplifier can be secured and energy saving becomes possible. In addition, in the amplifier of the invention, the size of the heat radiation plate and the capacitance of the power unit are smaller by 30–40% than those in the conventional analog amplifier but it has an advantage capable of obtaining the same output as the conventional analog amplifier, so that miniaturization is possible on the whole and there is also provided an effect which the fabrication costs are lowered.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. In a negative feedback D class amplifier using a PWM switching, a digital PWM input D class amplifier comprising:

a digital modulation part for modulating a PCM signal of an input audio to a PWM signal;

a pulse width generating and correcting part for comparing a difference between the PWM signal of the digital modulation part and an output signal negatively fed back, with a PWM ramp signal to generate a PWM switching signal;

an output part for generating an amplified output audio signal in response to the PWM switching signal of the pulse width generating and correcting part; and a voltage negative feedback loop for negatively feeding back a signal of the output part and decreasing a harmonic component to provide the signal to the pulse width generating and correcting part.

2. The digital PWM input D class amplifier according to claim 1, wherein the pulse width generating and correcting part comprises: a voltage amplifier for amplifying a difference between the PWM signal of the digital modulation part and the negative feedback output signal; a PWM-ramp converting part for receiving the PWM signal of the digital modulation part to generate a PWM ramp signal; and a comparing part for comparing an output signal of the voltage amplifier and the PWM ramp signal of the PWM-ramp converting part to generate a PWM switching signal.

3. The digital PWM input D class amplifier according to claim 2, wherein the pulse width generating and correcting part further comprises a filter for filtering the PWM signal of the digital modulation part through a low pass band to transfer the filtered PWM signal to the voltage amplifier.

4. The digital PWM input D class amplifier according to claim 2, wherein the PWM-ramp converting part comprises: a constant current source for generating positive/negative (+/−) saw tooth waves; first and second capacitors connected with an output of the constant current source; first and second switching transistors which are complementarily switched to charge or discharge the first and second capacitors; and a differential amplifier for differentially amplifying signals outputted through the first and second transistors.

5. The digital PWM input D class amplifier according to claim 1, wherein the output part comprises; a gate driver for generating a switch driving signal by the PWM switching signal of the pulse width generating and correcting part and amplifying the generated switch driving signal; a switching transistor switched by a signal of the gate driver; and a filter for demodulating a signal of the switching transistor into an output audio signal and outputting the demodulated output audio signal.

* * * * *